United States Patent [19]
Li et al.

[11] Patent Number: 5,638,291
[45] Date of Patent: Jun. 10, 1997

[54] METHOD AND APPARATUS FOR MAKING INTEGRATED CIRCUITS BY INSERTING BUFFERS INTO A NETLIST TO CONTROL CLOCK SKEW

[75] Inventors: Ying-Meng Li; Sunil V. Ashtaputre, both of San Jose; Jacob Greidinger, Cupertino; Mark R. Hartoog, Los Gatos; Moazzem M. Hossain; Siu-Tong Hui, both of San Jose, all of Calif.

[73] Assignee: VLSI Technology, Inc., San Jose, Calif.

[21] Appl. No.: 324,049

[22] Filed: Oct. 14, 1994

[51] Int. Cl.$^6$ ............................................. G06F 19/00
[52] U.S. Cl. ..................... 364/490; 364/488; 364/489; 364/491; 371/1
[58] Field of Search ..................... 395/500; 364/488, 364/489, 490, 491, 578; 327/292, 295, 170, 231; 371/1; 326/101, 93

[56] References Cited

U.S. PATENT DOCUMENTS

| | | | |
|---|---|---|---|
| 4,831,543 | 5/1989 | Mastellone | 364/489 |
| 5,239,215 | 8/1993 | Yamaguchi | 307/480 |
| 5,258,660 | 11/1993 | Nelson et al. | 307/269 |
| 5,299,137 | 3/1994 | Kingsley | 364/489 |
| 5,392,227 | 2/1995 | Hiserote | 364/578 |
| 5,396,435 | 3/1995 | Ginetti | 364/489 |
| 5,402,356 | 3/1995 | Schaefer et al. | 364/489 |
| 5,410,491 | 4/1995 | Minami | 364/491 |
| 5,452,239 | 9/1995 | Dai et al. | 364/578 |
| 5,499,192 | 3/1996 | Knapp et al. | 364/489 |

OTHER PUBLICATIONS

Li, Y.M. et al., "Skew Controllable Buffered Clock Tree, Compass Design Automation, Inc". Oct. 1994.

Chao et al., "Zero Skew Clock Routing with Minimum Wirelength," IEEE Trans. on Circuits & Systems–II, Nov. 1992, vol. 39, No. 11, pp. 1–30.

Jun Dong Cho et al., "A Buffer Distribution Algorithm for High–Speed Clock Routing ," Proc. of 30th Design Automation Conference, 1993, pp. 537–543. (month is not available).

Michael A.B. Jackson et al. "Clock Routing for High Performance ICs", Proc. of 27th Design Automation Conference, Jun. 1990, pp. 573–579.

Andrew Kahng et al., "High–Performance Clock Routing Based on Recursive Geometric Matching," Proc. of 28th Design Automation Conference, 1992, pp. 322–327. (month is not available).

Waseem Khan et al., "Minimum Skew Multiple Clock Routing in Synchronous ASIC Systems," The Proc. of 5th Intl. ASIC Conf. & Exhibit, 1992, pp. 22–25. (month is not available).

Ying–Meng Li et al., "A Zero Skew Clock Routing Scheme for VLSI Circuits," Proc. of IEEE Intl. Conf. on Computer–Aided Design, Nov. 1992, pp. 458–463.

(List continued on next page.)

*Primary Examiner*—Kevin J. Teska
*Assistant Examiner*—Tan Q. Nguyen
*Attorney, Agent, or Firm*—Hickman Beyer & Weaver

[57] ABSTRACT

The present invention discloses a method and an apparatus for making digital integrated circuits by considering ramp delay and clock skew as constraints while minimizing the number of inserted buffers and overall wire length connecting components for large clock trees. The invention includes developing a set of circuit specifications including maximum clock skew, minimum driveability, and maximum ramp delay. These specifications are described in a hardware description language on a digital computer system, and a netlist is synthesized from this hardware description. A modified netlist is then formed by analyzing the netlist and inserting buffers into it to satisfy the circuit specifications of skew, driveabilility, and ramp delay. Thereafter, a digital integrated circuit is produced as specified by the modified netlist.

20 Claims, 15 Drawing Sheets

OTHER PUBLICATIONS

Naveed A. Sherwani et al, "Clock Layout for High Performance ASIC Based on Weighted Center Algorithm," IEEE Intl. ASIC Conf. and Exhibit, Sep. 1991, pp. 15-5.1–15-5.4.

Jan-Ming Ho et al., "New Algorithms for the Rectilinear Steiner Tree Problem," IEEE Transactions on Computer-Aided Design, Feb. 1990, vol. 9, No. 2, pp. 185–193.

Tsay, Ren Song, "Exact Zero Skew," Proc. of IEEE Intl. Conf. on Computer-Aided Design, 1991, pp. 336–339.(month is not available).

Augustin, "Timing Models in Val/VHDL", IEEE 1989, pp. 122–125.

Boon et al.,"High Performance Clock Distribution for CMOS ASICS", IEEE 1989, pp. 15.4.1–15.4.5.

Saunders,"Logce Synthesis From a Hardware Description Language", IEEE 1989, pp. 1–8.

METHOD AND APPARATUS FOR MAKING INTEGRATED CIRCUITS BY INSERTING BUFFERS INTO A NETLIST TO CONTROL CLOCK SKEW

BACKGROUND OF THE INVENTION

This invention relates generally to the design of integrated circuits and more particularly to the automated design of integrated circuits by behavioral synthesis.

Over the past several decades, integrated circuits (ICs) have become an integral part of modern electrical devices. Rather than using off the shelf components, it is often desirable to use custom or semi-custom ICs. To permit easier circuit design of custom or semi-custom ICs to fulfill specific performance constraints or circuit requirements and to aid in circuit fabrication, automated systems for design and manufacturing have been developed.

One type of computer aided design (CAD) system is known as a "behavioral synthesis system." With such a system, the inputs, outputs and other circuit parameters are input into a computer using a hardware description language (HDL). Behavioral synthesis software then designs a circuit meeting these parameters.

A typical integrated circuit design and manufacturing process using behavioral synthesis begins with certain performance or structural constraints. A description of these constraints is made using an HDL such as VHDL or VERILOG which are commercially available behavioral synthesis languages. This HDL can be processed to form a "net" or "netlist" specifying components and their interconnections which meet the circuit constraints. However, the actual placement plan of components on wafers and the topography of the wiring connections is reserved for a subsequent "layout" stage.

Clock signals are used within integrated circuits to synchronize the operation of the various components. This timing is crucial in digital circuits since the combination of logic states at specified times of various components defines the function of a digital circuit. However, the routing of the connections between components can cause a disparity between clock signals at a particular time at different components within a circuit. This disparity is called clock skew and is defined in terms of signal delays between the input of the clock signal and its reception at the components in question.

Components using a single clock are represented as a subnet of the netlist called a "clocknet." A corresponding "clock tree" is a description of not only the components of the clocknet but also their manner of connection. Skew and driveability are particularly relevant for large clock circuits represented by correspondingly large clock trees. Driveabilty is directly related to the number of buffers (intermediate components), their collective capacitance, and the resistances of wires connecting the buffers. It is generally difficult to drive a large clock tree using a single buffer. Such a large clock tree may have large clock rise times or "ramp delays" on the order of nano-seconds and hence generate distorted clock signals.

A conventional method 10 for fabricating an integrated circuit is outlined in a flowchart in FIG. 1 beginning at a step 12. In a step 14, a set of circuit specifications is developed. Generally, these specifications can include the overall integrated circuit performance and also specific size and placement characteristics of components on a chip. In particular, maximum clock skew, minimum ramp delay, minimum driveability, number of buffers and total wire length may be specified.

A circuit designer will create a description of these specifications in a step 16 using a hardware description language (HDL). Common hardware description languages include VHDL and VERILOG although any suitable language can be used. This description of the specifications is then used in a step 18 to synthesize a netlist which specifies which components will be connected but does not specify the precise wiring topography. Components described by the netlist will form a circuit satisfying the circuit specifications. Those components which will share a common clock will be part of a clocknet which in turn is part of "netlist" or "net". At this stage, a conventional method would generally verify in a step 20 the behavior and functionality of the circuit described by the netlist.

Further referring to the conventional process of FIG. 1, the circuit designer transfers transforms the netlist description into a layout of the integrated circuit in a step 24. This layout step 24 determines the actual physical placement of components on the integrated circuit die or chip to form an array of gates or standard cells. The routing of connections or wires between components is also determined in layout step 24. The output of step 24 is data that is often in Caltech Intermediate Format (C.I.F.).

The C.I.F data created in the step 24 is then processed a step 26 to create a set of integrated circuit masks. These masks are used in the fabrication the integrated circuit chip. It has the precise pattern used for forming the connections of components on the chip. These masks are typically generated on a machine equipped to read C.I.F. data. This C.I.F. data can be transferred to this machine through a hard disk, magnetic tape, a floppy disk, or other means. It is also possible for the mask generating machine to be part of or the same machine that synthesizes the netlist.

An integrated circuit is produced in a step 28. A conventional method of producing the circuit is to use the masks created in step 26 in a photolithography process. Once the chip itself has been fabricated, the integrated circuit on the die must have connections to external circuitry. This is generally accomplished by attaching bonding wires and/or lead frames to the integrated circuit. The circuit is then encapsulated in packaging materials such as plastic. The design and fabrication of the integrated circuit ends at a step 30.

The insertion of buffers into digital circuits to rectify clock skew has been proposed by Tsay in "Exact Zero Skew", IEEE-CAD, pp. 336–339, 1991. However, Tsay does not outline a specific method for buffer insertion to minimize clock skew or specify how to minimize the number of inserted buffers. Cho et al. have proposed an insertion method in "A Buffer Distribution Algorithm for High Speed Clock Routing," *Proceedings of the 30th Design Automation Conference*, pp. 537–543, 1993. However, they do not account for buffer delay, and they increase the overall length of wire connecting components.

SUMMARY OF THE INVENTION

The present invention involves a method for making digital integrated circuits that considers ramp delay and clock skew as constraints while minimizing the number of inserted buffers and overall wire length connecting components for large clock trees. The method of the present invention includes developing a set of circuit specifications including maximum clock skew, minimum driveability, and maximum ramp delay. These specifications are described in a hardware description language on a digital computer system. A netlist is synthesized from this hardware description language. A modified netlist is then formed by analyzing the netlist and inserting buffers into it to satisfy the circuit specifications of skew, driveability, and ramp delay. Thereafter, a digital integrated circuit is produced as specified by the modified netlist.

A method for laying out a digital integrated circuit is also disclosed. This laying out method includes a step of analyzing a previously synthesized netlist describing at least one clock net and a step of inserting into the netlist a description of at least one buffer to form a modified netlist. The analyzing step is performed on a digital computer system, and the synthesized netlist is created by a synthesizer routine implemented on the digital computer system. The insertion step is performed such that no clock net described by the netlist has greater than a user-defined maximum clock skew, less than a user-defined minimum driveability, and greater than a user-defined maximum ramp delay.

In addition, an apparatus for creating integrated circuit masks is disclosed having a digital hardware description processor, a user input device, a digital storage, and a digital mask generator. The digital hardware description processor includes a central processing unit (CPU) coupled to the digital storage. The hardware description processor is operative to create mask generation data from a hardware description of a set of circuit specifications for a digital integrated circuit received from the user input device. These circuit specifications include a maximum clock skew, a minimum driveability, and a maximum ramp delay. The hardware description processor develops a netlist from the hardware description and inserts buffers, as required, into the netlist to provide a modified netlist. This modified netlist describes an integrated circuit having at most the maximum clock skew, at least the minimum driveability, and at most the maximum ramp delay. The hardware description processor develops the mask generation data from the modified netlist and stores the mask generation data in the digital storage. The digital mask generator is coupled to the digital storage for making at least one integrated circuit mask from the mask generation data stored in the digital storage.

An advantage of the present invention is that clock skew and ramp delay are reduced to meet circuit parameters. The method of the present invention is particularly effective of bringing clock skew and ramp delay within circuit parameters for circuit having large clock or trees.

These and other advantages of the present invention will become apparent upon reading the following detailed descriptions and studying the various figures of the drawings.

DETAILED DESCRIPTION OF THE PREFERRED EMBODIMENTS

The present invention provides both an explicit method and an apparatus for buffer insertion into large clock trees. The method determines parameters for subtrees of clock trees and inserts buffers into the subtrees based on the subtree parameters. By only inserting buffers at points balancing some or all of these parameters on subtrees, the insertion method automatically reduces the number of inserted buffers. A minimization of the length of wire connecting components and buffers is obtained based upon Steiner tree minimization techniques.

Figure 1:
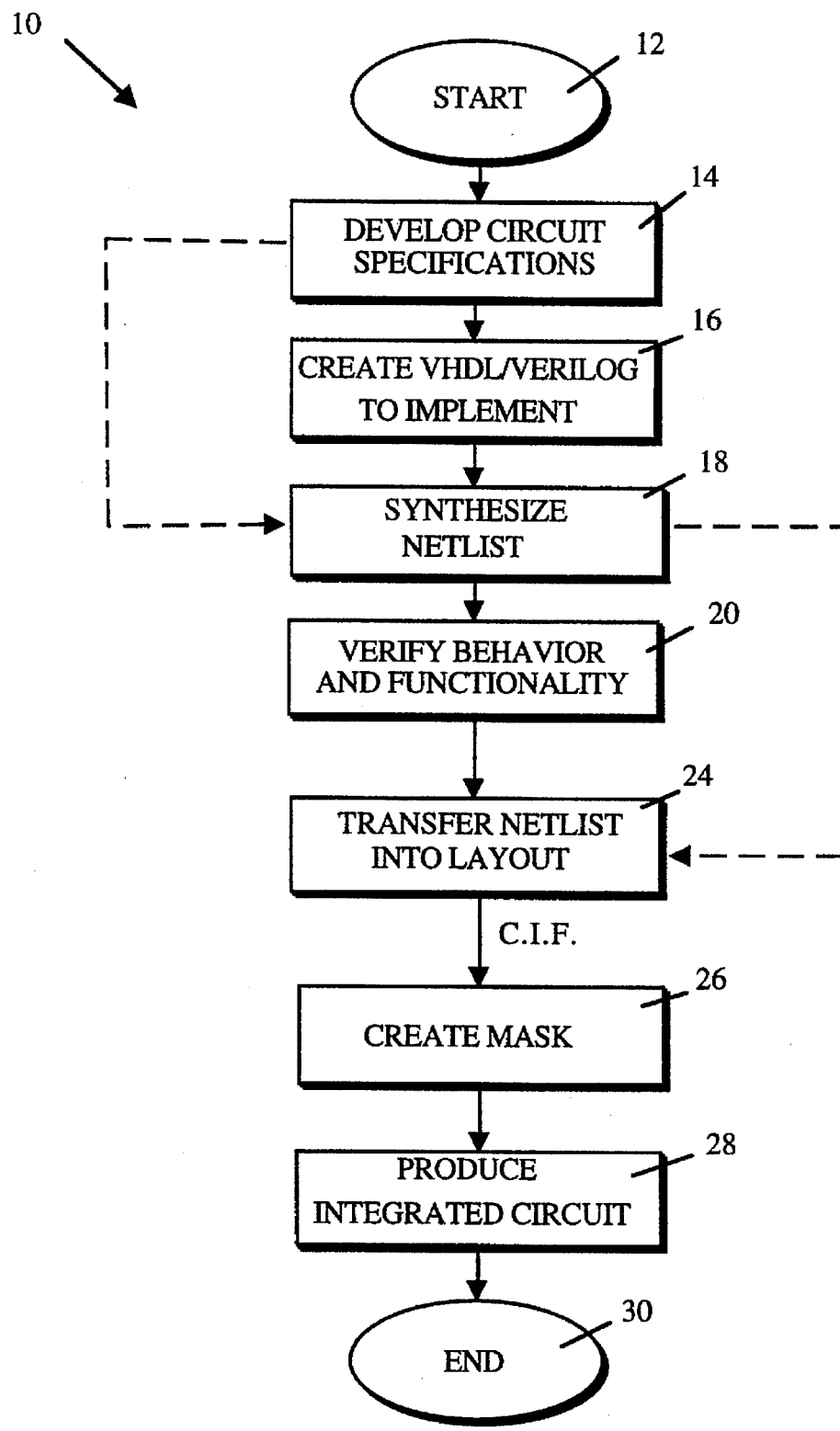
FIG. 1 is a flowchart illustrating a prior art process for designing and fabricating an integrated circuit.

Notice the dashed arrows in the prior process of FIG. 1. They show the steps of primary concern related to the invention. The present invention synthesizes a netlist from previously developed circuit specifications. The circuit specifications of chief importance for the invention are maximum skew, minimum driveability, and maximum ramp delay. That netlist is then transferred into a layout stage where placement, routing, and verification are performed.

Figure 2:
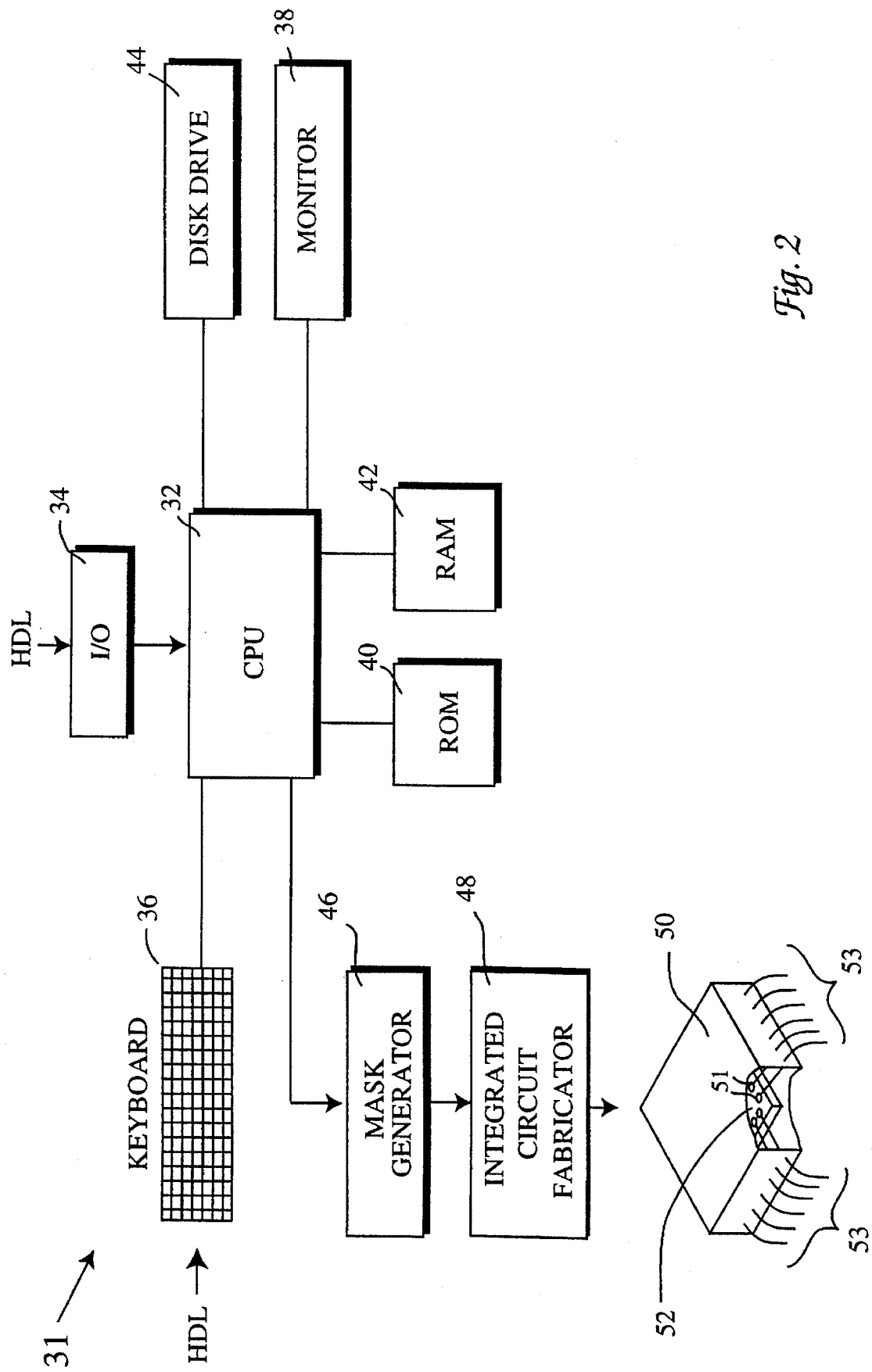
FIG. 2 is a schematic diagram of a block diagram of a system used for creating digital integrated circuits.

A schematic diagram of a digital hardware description processor 31 of the present invention used as a system for creating integrated circuit masks is shown in FIG. 2. The processor 31 includes a central processing unit (CPU) 32, an I/O port 34, a keyboard 36, a monitor 38, ROM 40, RAM 42, a disk drive unit 44, a mask generator 46, and an IC fabricator 48. CPU 32 is coupled to I/O port 34 and a user input device such as keyboard 36. HDL can be received and input into the digital hardware description processor 31 through the I/O port 34, the user input device 36 or another input channel such as disk drive 44. Typically, HDL received through the I/O port 34 would come from another machine. This could be the case, for example, when a netlist is synthesized by another computer. The user input device 36 usually takes the form of a keyboard. It permits the circuit designer to input circuit specifications such as clock skew, driveability, and ramp delay or to control netlist manipulations performed by the CPU. Of course, the circuit designer using the input device or keyboard 36 will typically use a monitor 38 also coupled to the CPU 32.

The digital hardware description processor 31 requires digital storage capacity. As shown in FIG. 2, this digital storage will typically include ROM 40, RAM 42, and a disk drive 44. The disk drive 44 may be used to store HDL received from the I/O ports 34 or the user input device 36 or may be used to enter HDL into the system, and it may store mask generation data created by processes running on the hardware description processor 31 and its CPU 32. The disk drive 44 may be replaced or augmented by other permanent storage devices such as magnetic tape or floppy disks.

As noted above, an original netlist can be either input through, for example, the I/O port 34 or the user input device 36, or it can be synthesized directly on the hardware description processor 31. This original netlist is then analyzed on the digital hardware description processor 31, and buffers are inserted as required into this netlist to produce a modified netlist. This modified netlist describes a circuit that has at most the maximum clock skew, at least the minimum driveability, and at most the maximum ramp delay specified by the circuit designer.

From the modified netlist, the hardware description processor 31 develops mask generating data. This mask generation data can be stored in the digital storage such as the disk drive 44. The mask generator 46 receives the mask generation data from the CPU 32. Alternatively, (not shown) the mask generator 46 may receive mask generation data directly from digital storage such as the disk drive 44. The mask generator 46 may be part of the hardware description processor 31, or it may be a separate device. The mask generation data, or C.I.F., is used by the mask generator 46 to create photolithography masks. These masks will be used in an integrated circuit fabricator 48 to form components of the integrated circuit on a wafer. The mask will be sufficient to create the components on the integrated circuit and the connections between the components. The integrated circuit fabricator 48 includes semiconductor manufacturing equipment such as etchers, machines, lithography machines, etc. as is well known to those skilled in semiconductor manufacturing.

In either case, the final result of processing by the integrated circuit fabricator 48 is a packaged integrated circuit 50. This packaged IC 50 will contain a die 52 created from using the mask created by the mask generator 46. The semiconductor die 52 contains a digital integrated circuit and I/O pads 51 for coupling the circuit to several leads 53. The I/O pads can be coupled to the leads 53 in any conventional manner such as by bonding wires.

As stated above, a netlist describes a net which in turn only specifies the components and their interconnections but not how they physically laid out and interconnected. In other words, a netlist is a functional description of a circuit. To make it a physical description, the netlist will be coupled with a layout method determining the placement of components and their precise routing or wiring connection.

Generally, the largest subnets of a net are clock nets. For a given net or netlist, there are generally only a finite number of clock nets. Therefore, a method for IC fabrication based upon modifying clock nets by modifying a netlist can only consider modifying a single clock net.

Figure 3:
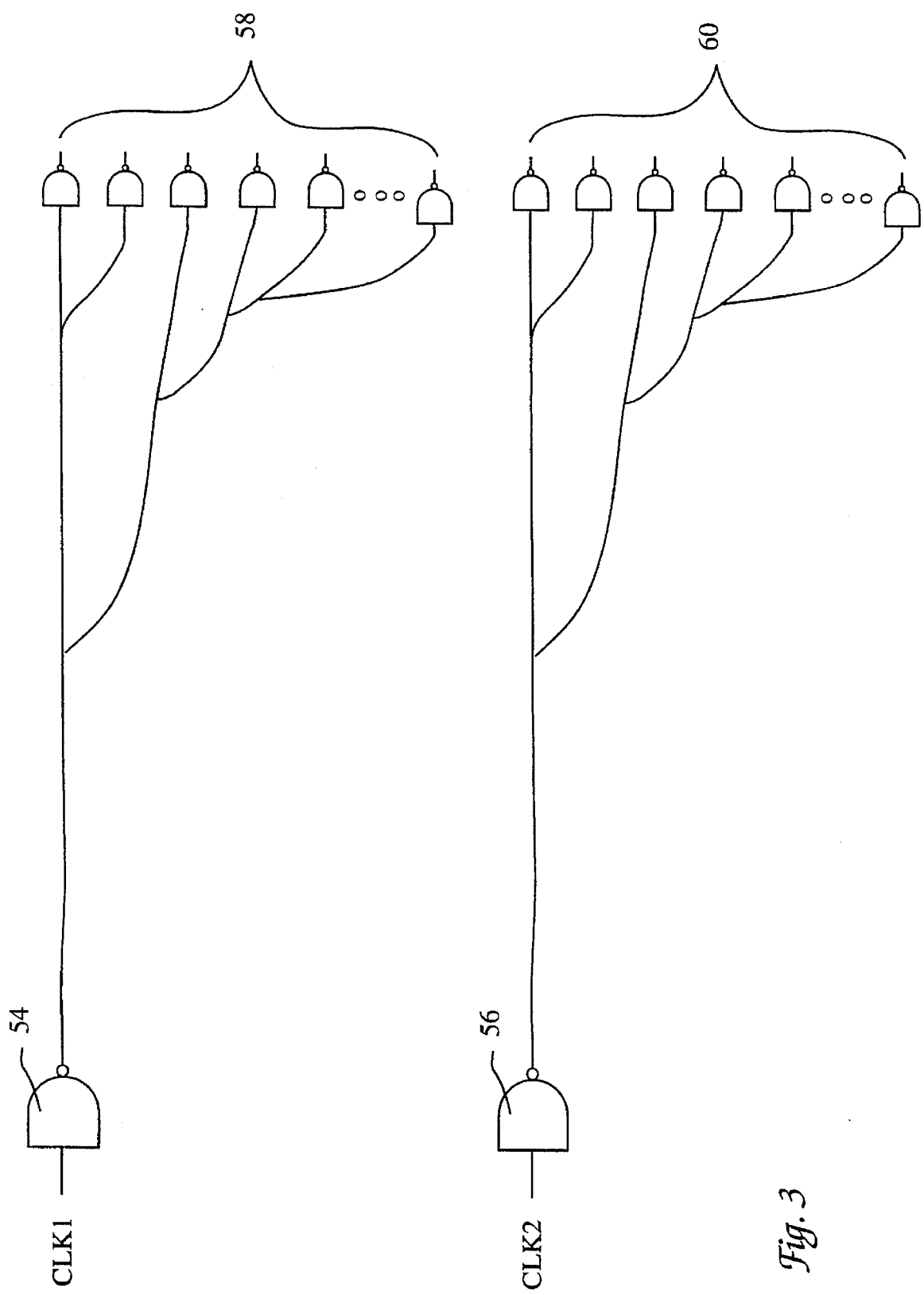
FIG. 3 is a diagram of a netlist containing clock nets.

FIG. 3 shows a netlist made up of two clock nets. The first clock net uses a clock CLK1, and the second clock net uses a clock CLK2. Initially, each clock net may be driven by a single driver such as driver 54 or driver 56. Unfortunately, these drivers 54 and 56 may be required to drive a large number, perhaps thousands, of components. By attempting to drive such large numbers of components, the drivers 54 and 56 will be burdened by the capacitive and resistive loads of the components themselves and their wiring connection. This large load will create clock skews and delays. Therefore, it may be advantageous to insert buffers 58 and 60 to act as intermediate drivers for hundreds, instead of thousands, of components and thus minimize clock skew and delay. Descriptions of these buffers 58 and 60 are inserted into the netlist to form a modified netlist describing the modified clock nets. This description of buffers 58 and 60 will correspond to actual components fabricated on the integrated circuit. The advantage of the method of the invention is that network parameters can be optimized without resynthesizing the behavior of the overall integrated circuit.

Figure 4:
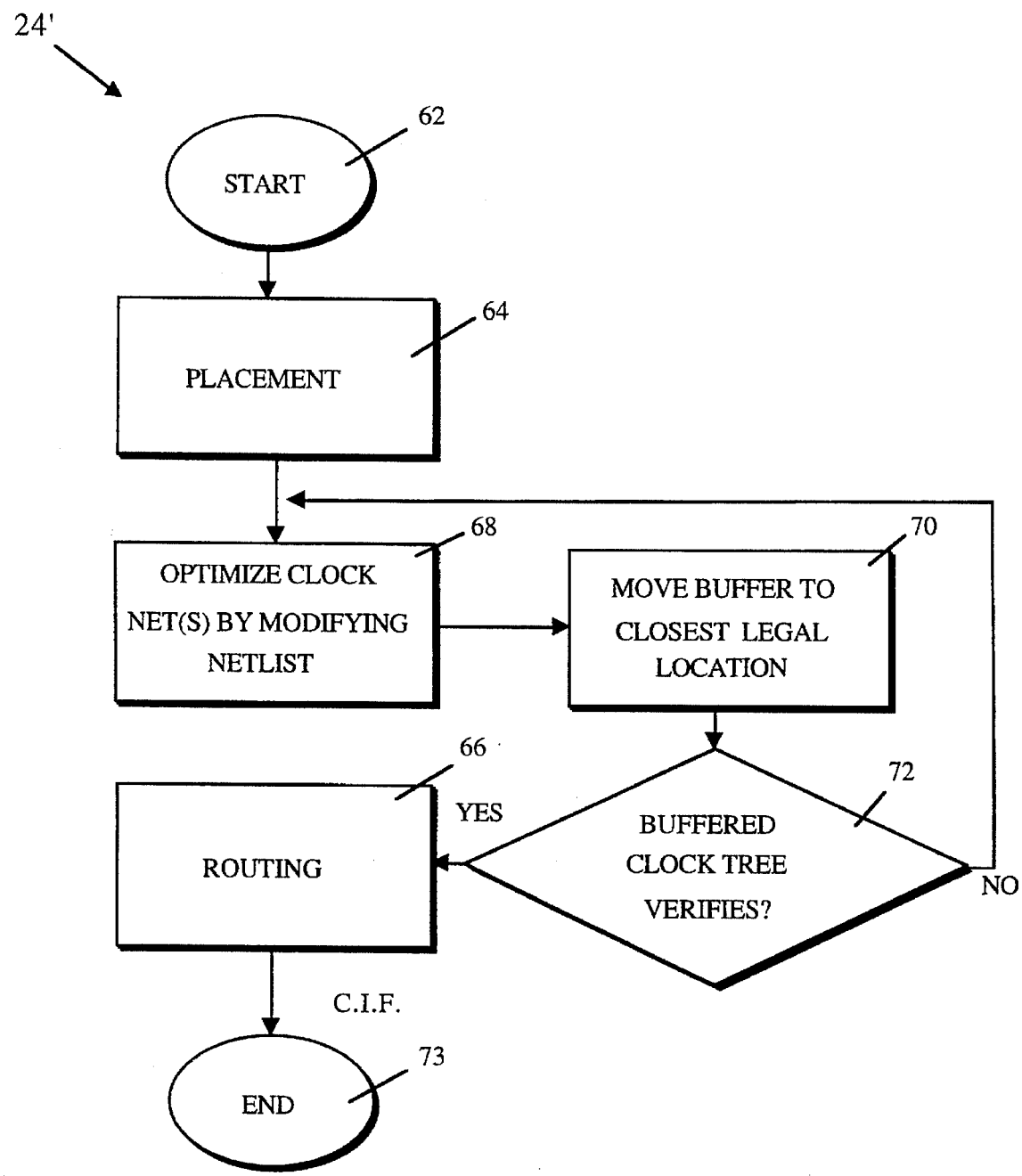
FIG. 4 is a flowchart illustrating a method for laying out a digital integrated circuit in accordance with the present invention.

Referring next to FIG. 4, a layout step 24' of the present invention will be described in more detail. This layout step 24' is different from and replaces the layout step 24 of the prior art process 10. The layout stage 24 begins at a step 62. In conventional layout step 24, only placement 64 and routing 66 steps are performed. The placement step 64 positions the components specified by the netlist onto a grid representing their placement on the integrated circuit die 52. The routing step 66 determines the precise connections of components specified by the netlist. As noted above, the netlist only specifies that certain components are connected and does not describe the precise routing, or wiring, required to connect those components.

The method of the present invention adds additional steps 68, 70 and 72 to the layout step 24'. Invention step 68 optimizes clock nets by modifying the original netlist as described above. This optimization step 68 contains a step of analyzing on the digital hardware description processor 31, a previously synthesized netlist. After this initial netlist has been analyzed, descriptions of buffers 58 and 60 are inserted into the netlist to create a modified netlist.

Because the placement of components of the original netlist has been performed in a step 64, it is possible that the buffer insertions dictated by step 68 may require the placement of inserted buffers 58 and 60 into physical locations already reserved for other components. Therefore, a step 70 may be required to adjust the placement of the inserted buffers 58 and 60. This adjustment will not generally require the inserted buffer to be moved very far from its optimum position. Alternatively, components previously placed in a step 64 may be moved slightly to accommodate the inserted buffer.

The timing of the circuit is verified in step 72. Generally, this step will require the circuit designer to determine whether the resulting circuit satisfies enough of the circuit specifications to warrant going to the step 66 to determine the precise wiring of components. At step 72, it is possible that all of the specifications by the designer may not have been met. If not, the designer may change the circuit specifications at step 72 and either proceed with routing 66 or return to the optimization step 68. Once either the buffered clock tree passes all of the circuit specifications or the circuit designer decides to proceed, the routing step 66 is performed. After the routing step 66, C.I.F. mask generation data is transferred out of the layout step 24' once it concludes at a step 73. This C.I.F. information is used by a mask generator 46 in a mask creation step 26 to create IC fabrication masks.

Figure 5:
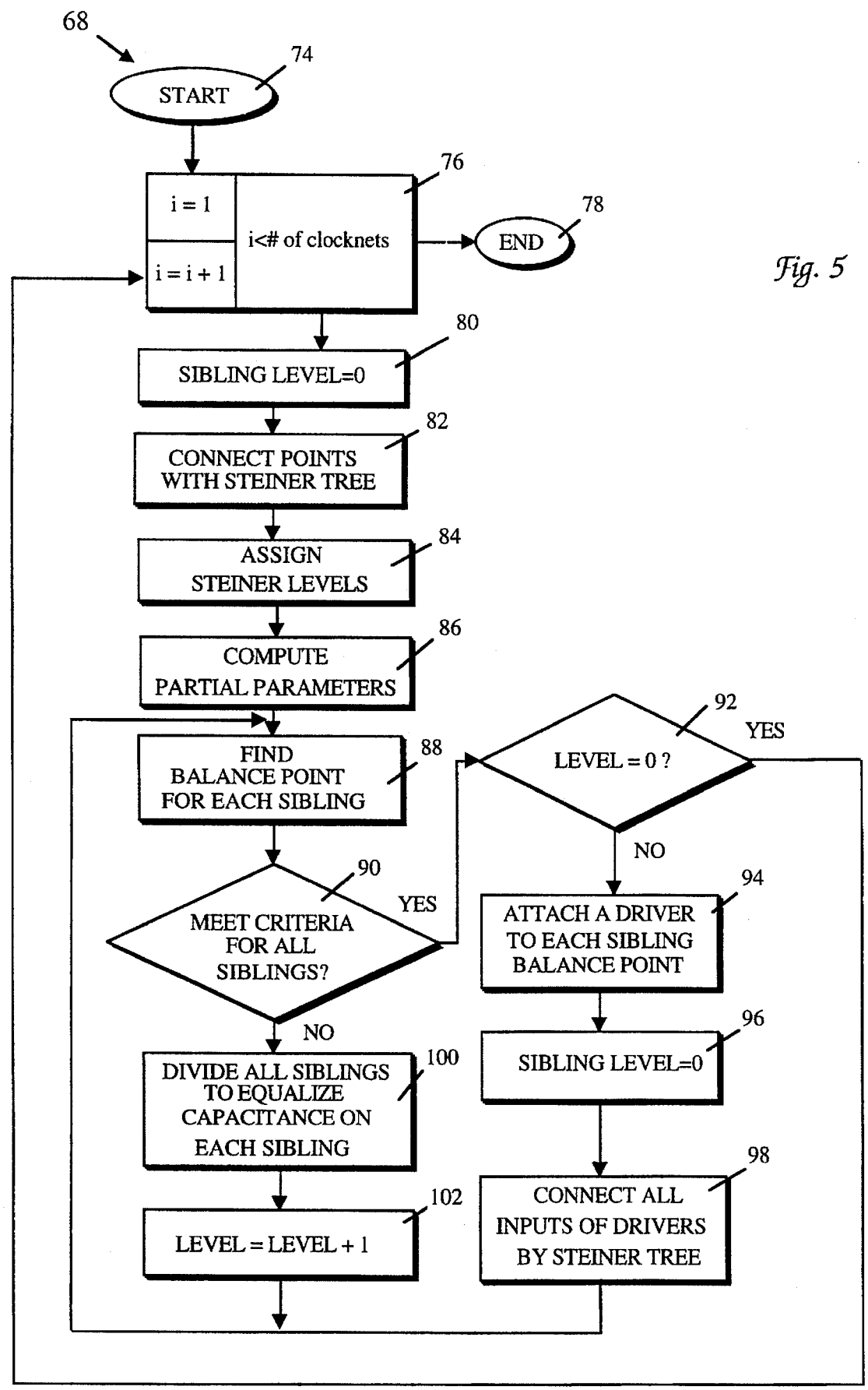
FIG. 5 is a flowchart describing a greater detail of the optimization step 68 of FIG. 4.

FIG. 5 is a flow chart detailing the clock net optimization step 68 beginning at a step 74. The optimization process 68 iterates in a step 76 over the number of clock nets in the chosen netlist. Once the iteration integer i is equal to the number of clock nets, the optimization ends at a step 78.

A sibling level number is assigned to each node which is a member of a selected clock net or clock tree. This sibling level number essentially specifies the level of branches one must traverse to reach the top level where the initial driver 54 or 56 is placed. A sibling level of zero corresponds to being at the top level. The maximum sibling level, whatever it may be, corresponds to several nodes at the bottom of the clock tree or clock net which are the farthest nodes away from the top of the clock tree. In a step 80, sibling level zero is selected corresponding to the node having the single driver 54 or 56 at the top of the clock tree.

The points or nodes representing components of the clock tree are then connected by a Steiner tree in a step 82. Steiner trees are a conventional method for connecting components using a minimal length of wire. Steiner trees are described in "New Algorithms for Rectilinear Steiner Trees" by J. M. Ho et al., IEEE-CAD, Volume 9, No. 2, pp. 161–166, 1990, which is incorporated herein by reference. In our case, the Steiner tree will connect components whose location have already been specified to be on a grid in the placement step 64. Of course, minimizing wire length is generally desirable in the construction of circuits to contain costs. The Steiner equal to the clock trees; the clock trees specify which components are connected to a particular clock while the Steiner trees represent potential wiring configurations between components of a particular clock net. Because the clock trees are not equal to the Steiner trees, the Steiner trees will require a separate assignment of levels in a step 84.

Partial parameters of the Steiner trees are computed in a step 86. Partial driveability represent the collective capacitance and resistance of subcircuits which are nodes in the clock tree. By adding the capacitances of components and subcircuits in the lower levels of the clock tree, one can obtain a partial capacitance for the subtree of the clock net. These partial capacitances along with resistances corresponding to components in a subtree and their wiring connections can be used to determine driveability at selected levels within a clock tree. Therefore, buffers 58 and 60 can be inserted to enhance driveability at these selected levels.

As noted previously, skew is the difference between maximum and minimum latency delays between specified levels in the clock net. Ramp delay is the delay between specified points or nodes representing subcircuits of the clock net. Partial capacitances can be used to determine partial clock skews and ramp delays at given levels within a clock tree.

Steps 88–102 define a recursive routine for placing drivers into the Steiner tree. In a step 88, a balance point for each sibling of a particular Steiner tree is found. The balance point is defined as a point at a particular level in the Steiner tree where the skew is minimized. This skew is measured between the chosen level and the lowest level of the Steiner tree. If the circuit requirements are met for each sibling of the Steiner tree, then in a step 90, a decision is made to go to a decision 92 to determine whether the Steiner tree level is zero. If it is zero, a level within the clock net level satisfying all the circuit specifications has been reached. Therefore, the iteration over clock nets in step 76 precedes to the next clock net.

If the level is not equal to zero in decision step 92, the process proceeds to step 94 where a driver or buffer is inserted at each Steiner sibling balance point. Exemplary buffers 58 and 60 were discussed with reference to FIG. 3. By attaching buffers to the balance points, the process assures that partial skew on the subtrees is minimized. The buffers attached in step 94 are then set to be at the top level of the Steiner subtrees by setting the Steiner level to zero in a step 96. The balance points, the points where the inputs of the drivers are attached in step 94, are then connected in a step 98 by Steiner trees to the other points already part of the previous Steiner tree. The optimization step 68 then returns to step 88 to find the balance points for each sibling of the new Steiner subtree.

If the circuit requirements are not met at decision step 90, then all siblings of Steiner trees are divided into subtrees having equal capacitance in a step 100. The Steiner tree level is then incremented in a step 102, and the optimization step 68 returns to step 88 to find balance points for each sibling of the new Steiner tree level.

Through the usage of decisions 90 and 92, the optimization step 68 ensures, in a recursive manner, that all of the Steiner subtrees of a particular clock net meet the circuit specifications and all inserted buffers are attached at points which minimize the partial skew on the subtrees. Since the step 76 loops over all clock nets of a netlist, all clock nets will also meet the specifications and have buffers inserted at points minimizing clock skew. Because the buffers are inserted only if needed to satisfy the driveability, ramp delay, or skew budget considerations, this procedure automatically minimizes the number of inserted buffers. If none of the above criteria is violated, no buffers are inserted. Furthermore, the usage of Steiner trees will minimize the length of wire required to connect the components of the buffered clock tree, a subtree of the modified netlist.

Figure 5A:
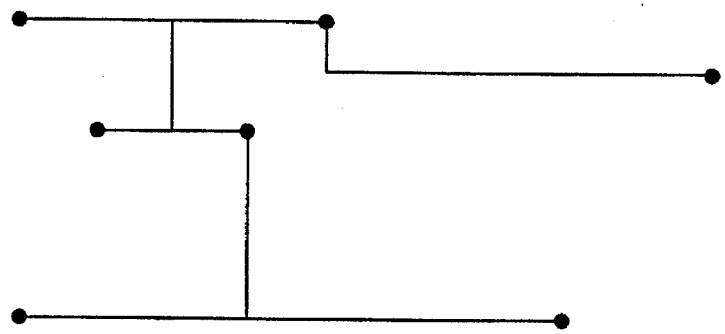
FIG. 5a–d show the modification of a netlist by the steps of FIG. 5.
Figure 5B:
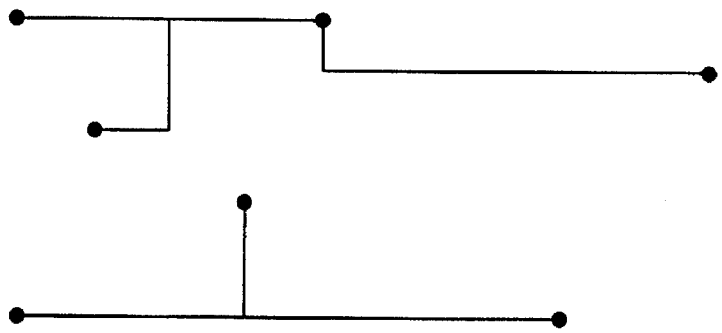
Figure 5C:
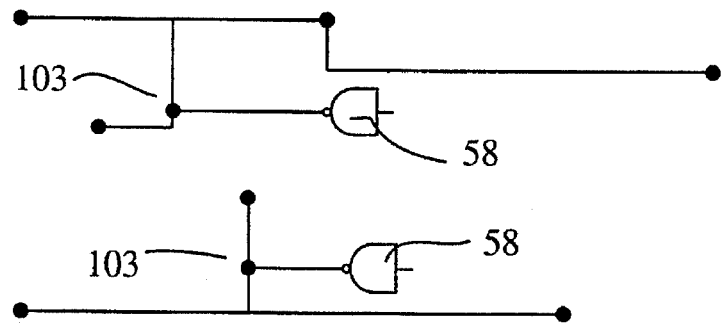
Figure 5D:
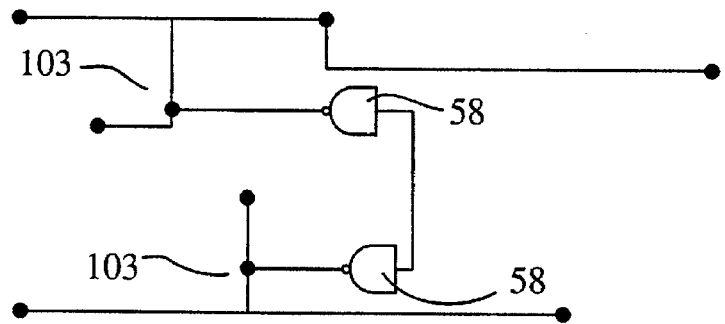

FIGS. 5a–5d illustrate some of the steps of optimization step 68 just described. FIG. 5a shows points for nodes of a clock tree connected by a Steiner tree as a result of a step 82. This Steiner subtree is then divided in FIG. 5b as it would be as a result of step 100 to equalize capacitances on the two resulting sibling Steiner subtrees. The attachment or insertion of inputs of buffers 58 to balance points 103 of these resulting siblings Steiner subtrees is shown in FIG. 5c. This configuration would result from step 94 described in FIG. 5. As result of step 98 in FIG. 5, the balance points themselves now become points of their respective Steiner subtrees and the outputs of the buffers 58 are then connected to form a new tree as shown in FIG. 5d.

Figure 6A:
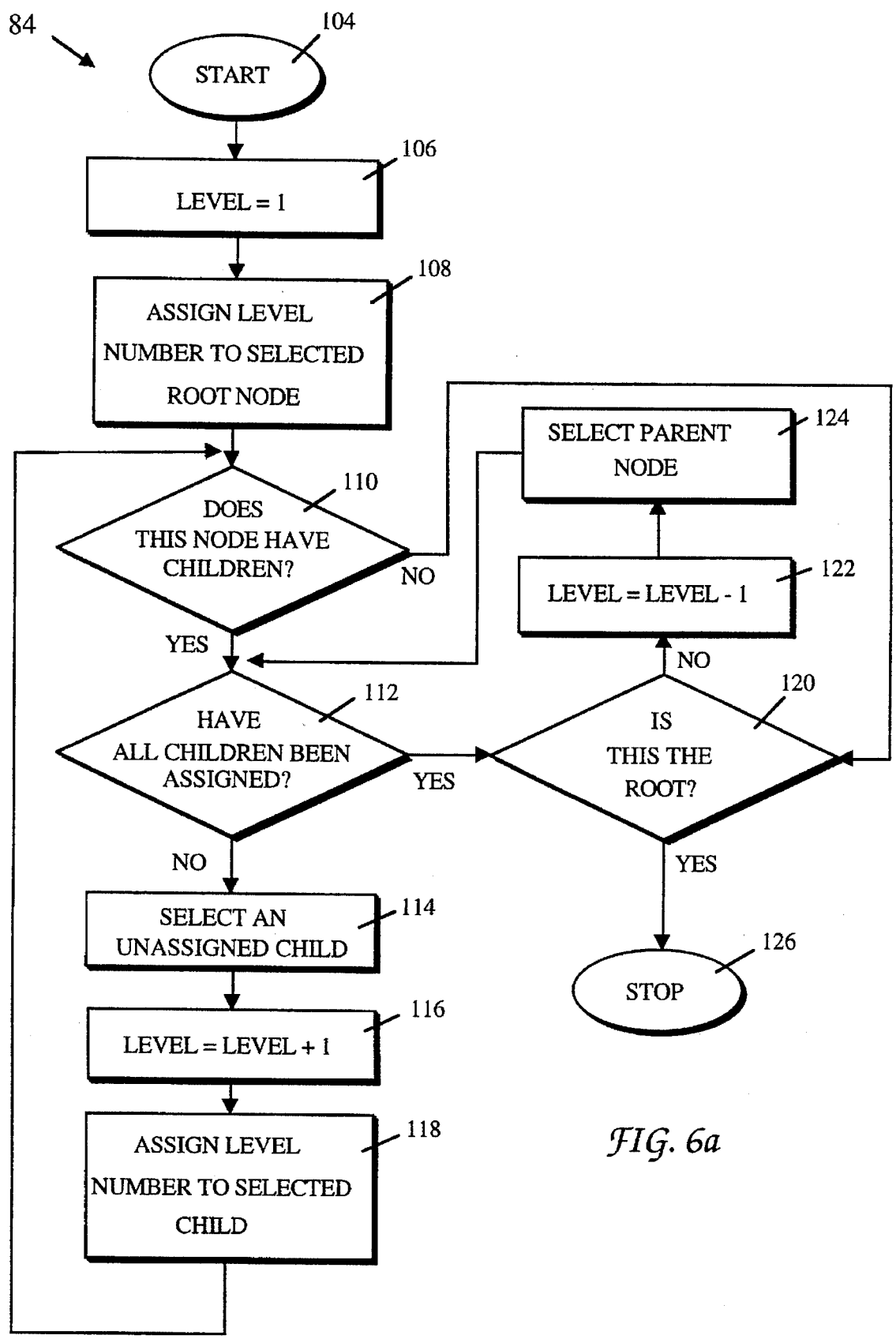
FIG. 6a is a flowchart describing in greater detail the "Assign Steiner Levels" step 84 of FIG. 5.

Step 84 described with reference to FIG. 5, the step of assigning Steiner levels, will now be described in more detail with reference to FIG. 6a. This assignment starts at step 104 and assigns level number 1 in a step 106 to the top of the Steiner tree. Step 108 assigns this level number from step 106 to the selected root node. If the selected node has child nodes, decision step 110 passes the assignment procedure 84 to decision step 112. For the root node, unless it is the only node, it will certainly have children and the process 84 will continue with decision step 112. This no decision from step 112 and subsequent steps in the left column of FIG. 6a assign Steiner level numbers to unassigned children of the selected node.

A previously unassigned child of the selected node is selected in step 114. Because this child is at a lower node than the root, its parent, this child is assigned the Steiner level of its parent plus 1. The Steiner level is incremented by one in step 166 and assigned to the child in step 118. The level assignment procedure 84 then returns to decision step 110 to determine whether this child has children of its own. If the child does indeed have children, steps 112–118 are repeated until the children at the bottom of the tree have been reached.

Upon reaching the bottom of the tree, a decision step 110 transfers the assignment procedure 84 to decision 120 to determine whether this child is the root. Decision 120 will be reached the first time when the bottom of the tree will have been reached for the first time. Therefore, unless there is only one node in the entire tree, decision 120 will answer no and the level number will be decremented by one in step 122 corresponding to the parent of the last selected child. This parent is selected in step 124 and all unassigned children of this parent are searched for in decision 112 and selection step 114.

All children of the last selected parent are selected and assigned in turn by steps 110–118. After all children have been assigned, decision step 120 is reached once again and the parent of the last selected child is chosen in step 174. This procedure will methodically search out and assign all nodes of the Steiner tree until the root is reached. When all children of the root have been assigned, decision step 120 is affirmative at the process 84 ends at step 126.

Figure 6B:
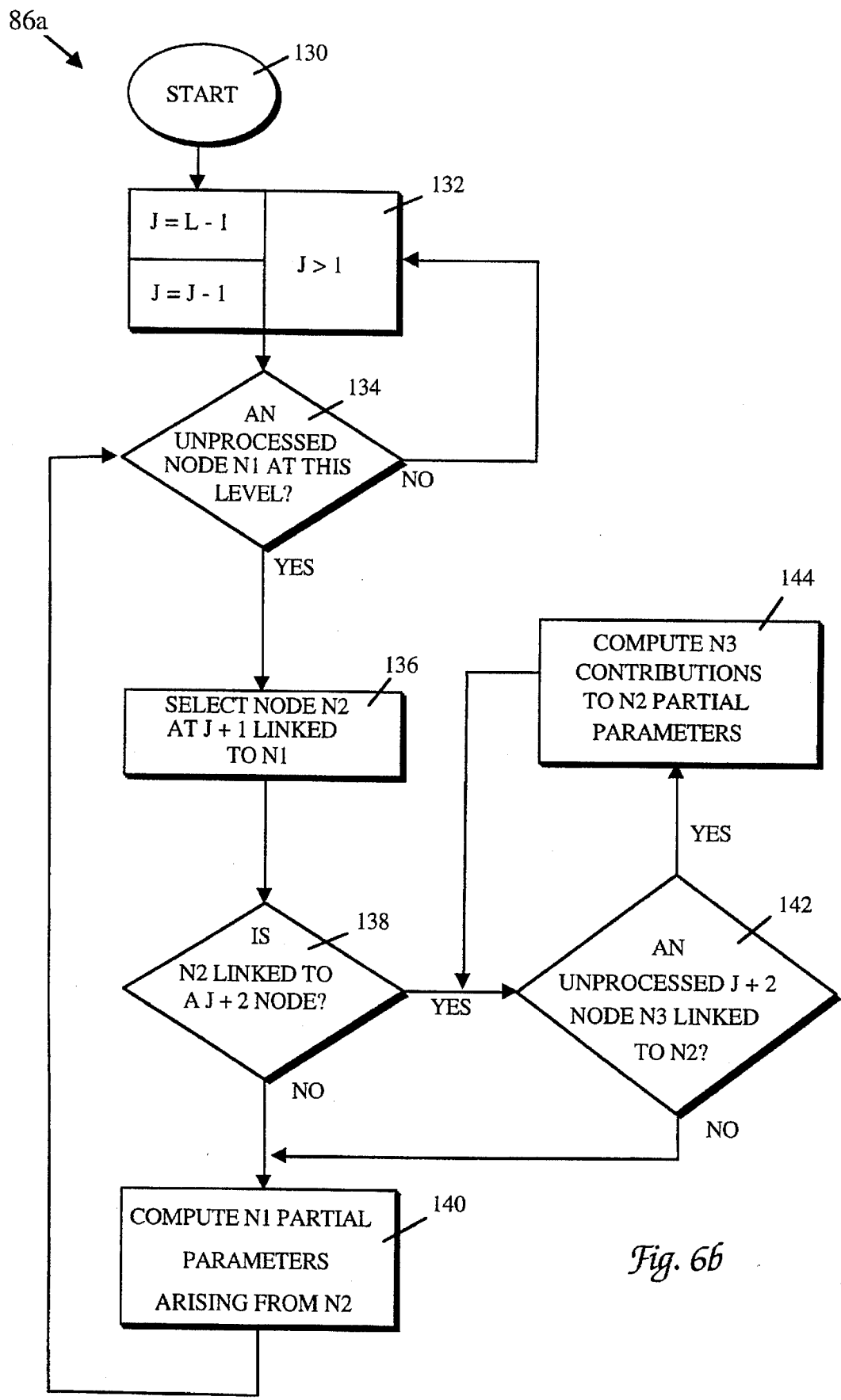
FIG. 6b is a flowchart describing in greater detail a first half of the "Compute Partial Parameters" step 86 of FIG. 5 by using a bottom up scan.
Figure 6C:
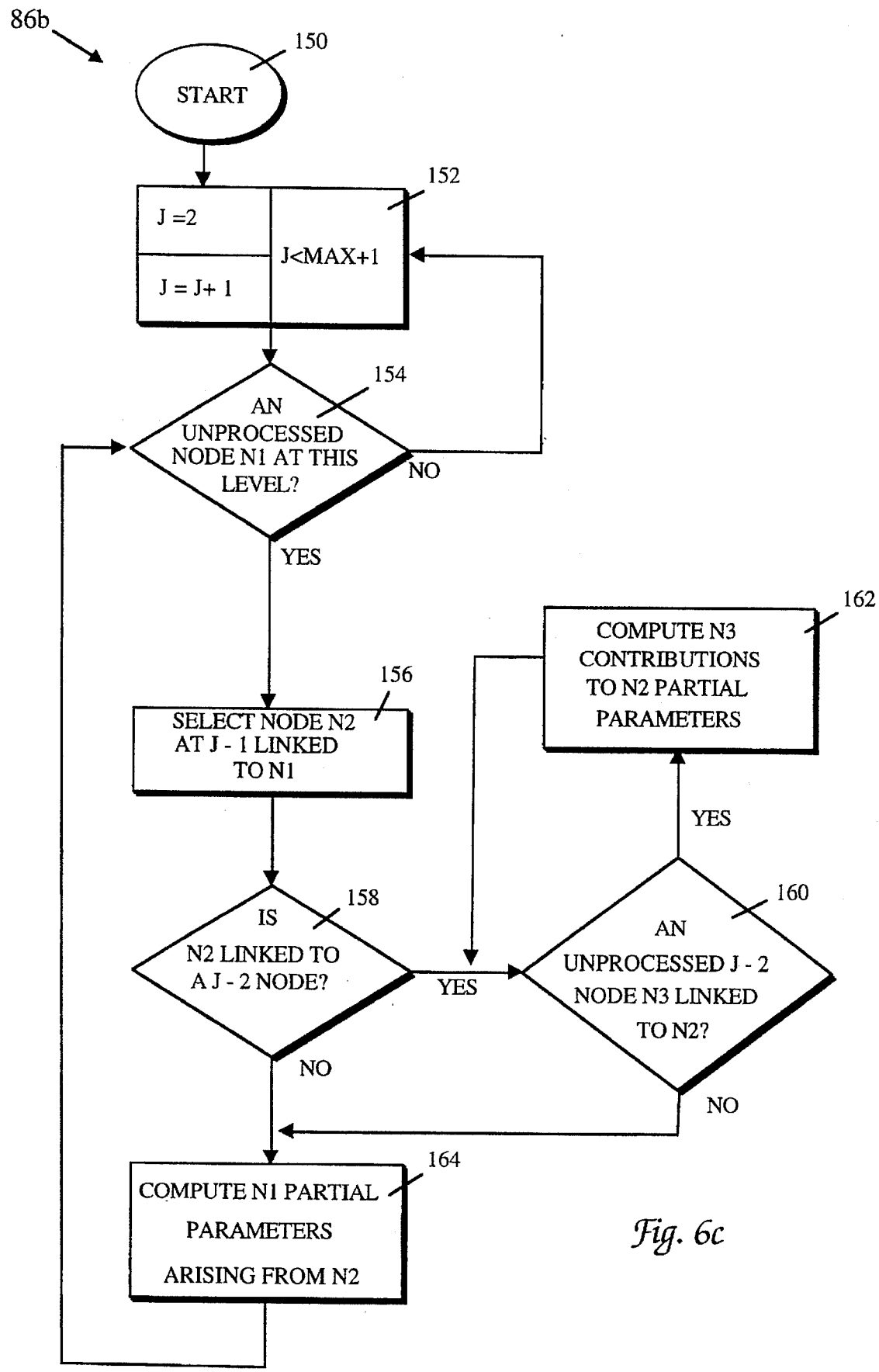
FIG. 6c is a flowchart describing in greater detail a second half of the "Compute Partial Parameters" step 86 of FIG. 5 by using a top down scan.

The first half 86a of step 86 of computing partial parameters will now be described with reference to FIG. 6b beginning at a step 130, the second half 86b of the calculation 86 will be described with reference to FIG. 6c. FIG. 6b is a flow chart detailing a "bottom up scan." An iteration over Steiner levels begins in step 132. The iteration variable J starts at level L−1. The upper limit of the iteration is J=1, representing the top, or root, of the Steiner tree. In this way, parameters will be computed related to lower levels in the Steiner tree.

Decision step 134 determines whether there are unprocessed nodes such as N1 at the J level. If not all the nodes have been processed at this level, a node N2 linked to N1 at the Steiner level J+1, Steiner level L is selected. Decision step 138 determines whether there are J+2 nodes, linked to N2. If the answer to the decision in step 138 is no, then the N2 contributions to the partial parameters arising from N2 are computed in step 140. In this way, the contributions to N1 parameters arising solely from N2 will be computed. The process of computing partial parameters 86 then returns to decision 134, and continues to compute the parameters for all nodes N2 at the bottom of the tree.

If the answer to decision tree 138 is "yes," we are no longer at the bottom of the tree. If there are unprocessed J+2 nodes that are linked to N2 as will be determined in decision step 142, then all of those contributions to N2 partial parameters will be computed in step 144 recursively. When decision step 142 finally answers no, then the contributions arising solely from N2 partial parameters are computed in step 140.

The bottom up computation then proceeds back to decision step 134 until that step answers "no" resulting in a decrement of J in iteration step 132. This decrement represents moving one level up in the tree. This process continues until all lower level contributions to upper level nodes have been computed. The partial parameters computed include partial capacitances, partial minimum latency delays, partial maximum latency delays, and partial ramp delays.

Let $W_{N1,N2}$ denote the length of wire between nodes N1 and N2. Further, denote the capacitance per unit length by c and the resistance per unit length by r. The capacitance partial parameter on node N1 arising from node N2, $C_{N2}(N1)$, is computed from the formula $$C_{N2}(N1)=\Sigma_{N3}C_{N3}(N2)+C(N2)+c\,W_{N1,N2}$$

where C(N2) equals the input capacitance to the device at N2 if N2 is a device and is equal to zero otherwise. The summation is over nodes N3. One can further define constants a and b to determine the trip point on the waveform to measure the delay. It will be assumed that a=0.5 and b=1. Then the maximum delay partial parameter $D_{N2}(N1)$ on node N1 arising from N2 is $$D_{N2}(N1)=\max_{N3}[D_{N3}(N2)]+(arc)[W_{N1,N2}]^2+(brc)W_{N1,N2}[\Sigma_{N3}C_{N3}(N2)+C(N2)]$$

Similarly, the minimum delay partial parameter $D_{N2}(N1)$ on node N1 arising from N2 is $d_{N2}(N1)$ $$d_{N2}(N1)=\min_{N3}[D_{N3}(N2)]+(arc)[W_{N1,N2}]^2$$

$R_{N2}(N1)$ is the partial ramp delay on node N1 arising from node N2+$(brc)W_{N1,N2}[\Sigma_{N3}C_{N3}(N2)+C(N2)]$ $$R_{N2}(N1)=\min_{N3}[R_{N3}(N2)]+(arc)[W_{N1,N2}]^2+(brc)W_{N1,N2}[\Sigma_{N3}C_{N3}(N2)+C(N2)]$$

These four formulas are used for both bottom up and top down calculations.

The "top down scan" 86b of computing the partial parameters 86 will now be described in more detail with reference to FIG. 6c beginning at a step 150. This process proceeds in much the same fashion as the bottom up scan 86a, except that it goes down, instead of up, the Steiner tree. Iteration 152 begins at Steiner level J=2 corresponding to the level just below the root level of the Steiner tree. This loop extends to the highest level number, or bottom, of the Steiner tree. If there is an unprocessed node at the selected level J, then decision step 154 answers yes, and step 156 selects a node above the N1 node. As determined in decision 158, if there is a node just above N2, then the contributions of that node N3 are computed by a decision 160 and a step 162. Once all contributions to N2 from a level closer to the root than the N2 node have been computed, then decision step 160 permits the computation of the partial parameters resulting from N2 itself at step 164. The top down scan then returns to decision step 154.

In this way, all contributions of nodes above a given level are computed. By combining the top down scan 86b (FIG. 6c) with the bottom up scan 86a (FIG. 6b), all partial parameters resulting from contributions above and below a particular node are known. This permits a later splitting of Steiner trees into subtrees of equal capacitances.

Figure 7:
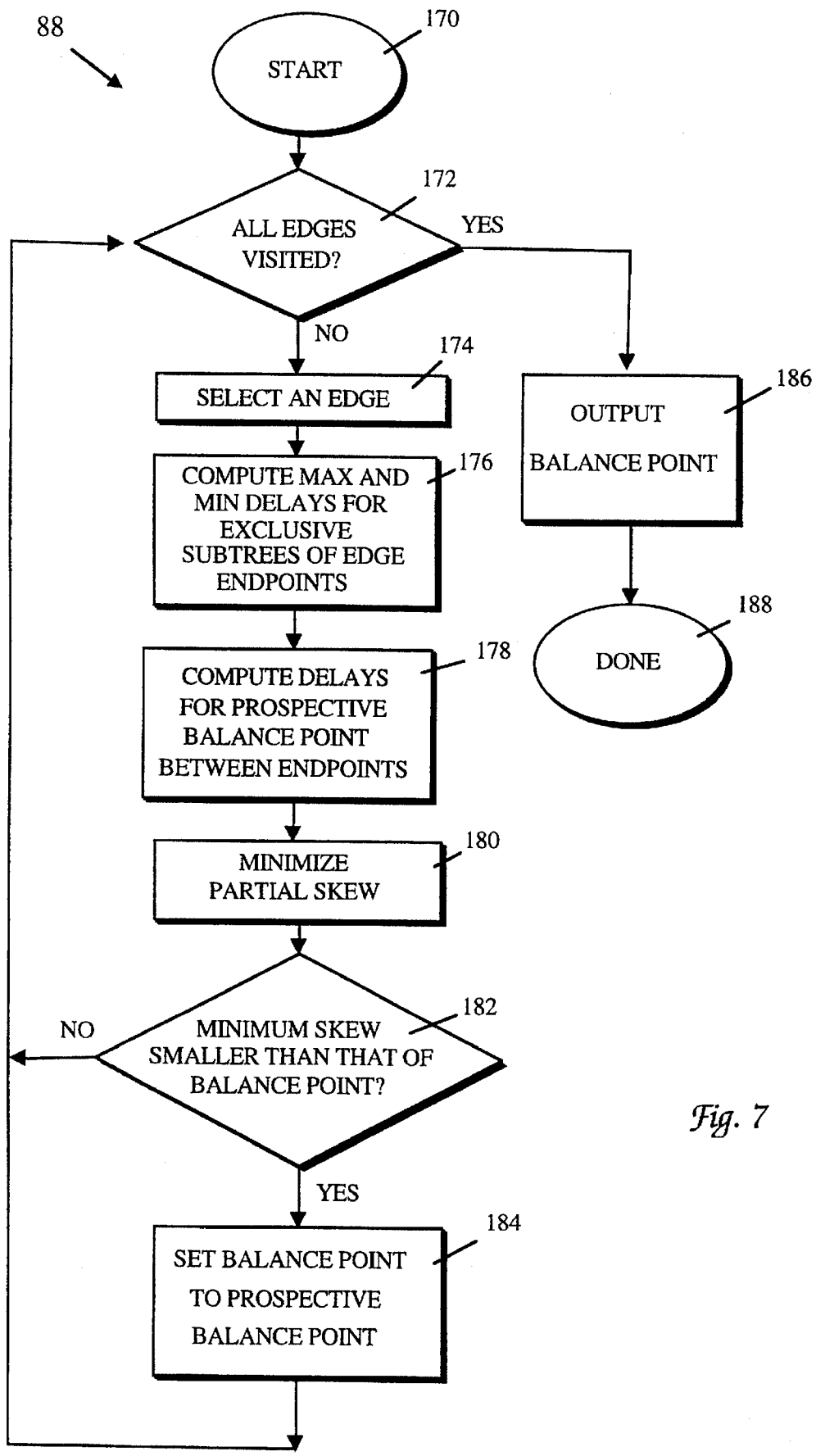
FIG. 7 is a flowchart describing in greater detail the "Find Balance Point" step 88 of FIG. 5.

Once the partial parameters have been computed in a step 86, a step 88 of FIG. 5 of finding balance points can proceed beginning at a step 170 in FIG. 7. If not all edges have been visited, as determined in step 172, then an edge is selected in step 174. Edges may simply be viewed as segments connecting two nodes in a Steiner tree. The edges represent wires connecting the subcircuits represented by nodes. Each of the two nodes connected to an edge will have two trees exclusive of the other formed by removing the edge from the Steiner tree.

For each pair of exclusive subtrees, step 176 computes the maximum and minimum delays between all nodes within the exclusive subtree. Step 178 then computes the delays for prospective balance points between the end points of the selected edge. Step 180 then uses these delays to minimize the partial skew. The point minimizing that partial skew is therefore a prospective balance point. If the minimum skew for that prospective balance point is not smaller than the skew for a previous prospective balance point, then the decision block 182 is "no", and the process 188 returns to decision block 172. However, if the new prospective balance point has a smaller minimum skew than what has been previously calculated, that new prospective balance point is set to be the balance point in step 184. The process of finding the balance point 188 then returns to decision step 172 to search for other balance points which may have smaller minimum skew. Once all of the edges have been visited, the balance point having the smallest minimum clock skew is output to the digital storage in a step 186, and the process of finding the balance point ends at step 188.

Figure 8:
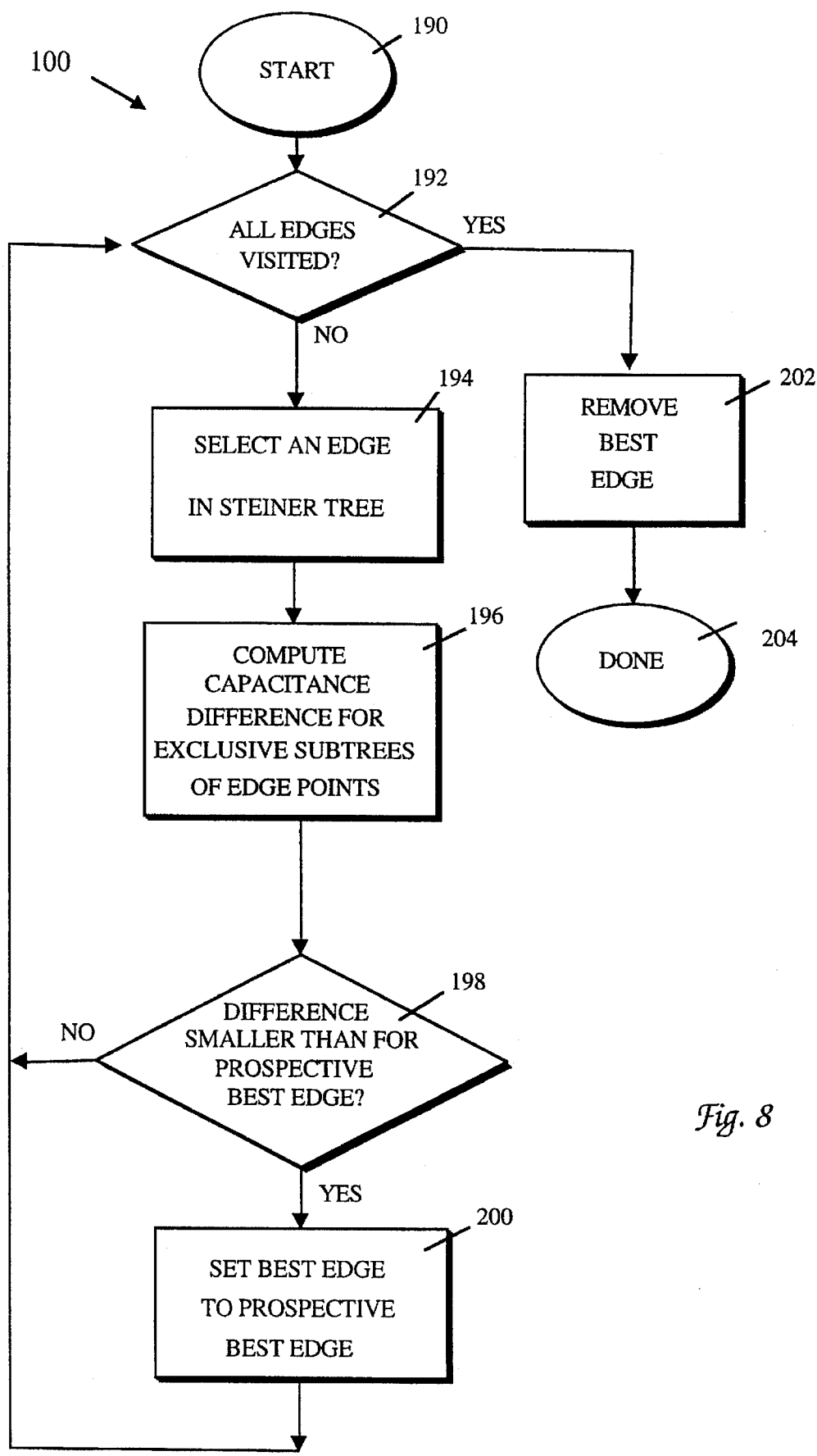
FIG. 8 is a flowchart describing in greater detail the "Divide All Siblings" step 100 of FIG. 5.

The procedure 100 of FIG. 5 for dividing all Steiner siblings to equalize capacitances on each sibling will now be described with reference to FIG. 8. Procedure 100 begins at a step 190 and is very similar to the procedure 88 for finding balance points for each sibling described with reference to FIG. 7. If not all edges have been considered, as determined by decision 192, then an edge of the Steiner tree is selected in step 194. The capacitances for the exclusive subtrees of the edge points is computed enabling the determination of the difference between these capacitances in step 196. If that difference is smaller than the difference computed for a prospective best edge, then decision 198 is "no," and the process 100 returns to decision 192. If the decision 198 is "yes," then the prospective edge is labeled the best edge in step 200, and the process of dividing siblings returns to decision step 192. Once all the edges have been visited, the best edge is removed in step 202. The procedure 100 for dividing sibling ends at step 204.

This step 204 also concludes invention step 68 of optimizing the clock nets by modifying the original netlist. The invention then proceeds to step 70 of FIG. 5 of moving the inserted buffers to their closest legal location.

Figure 9:
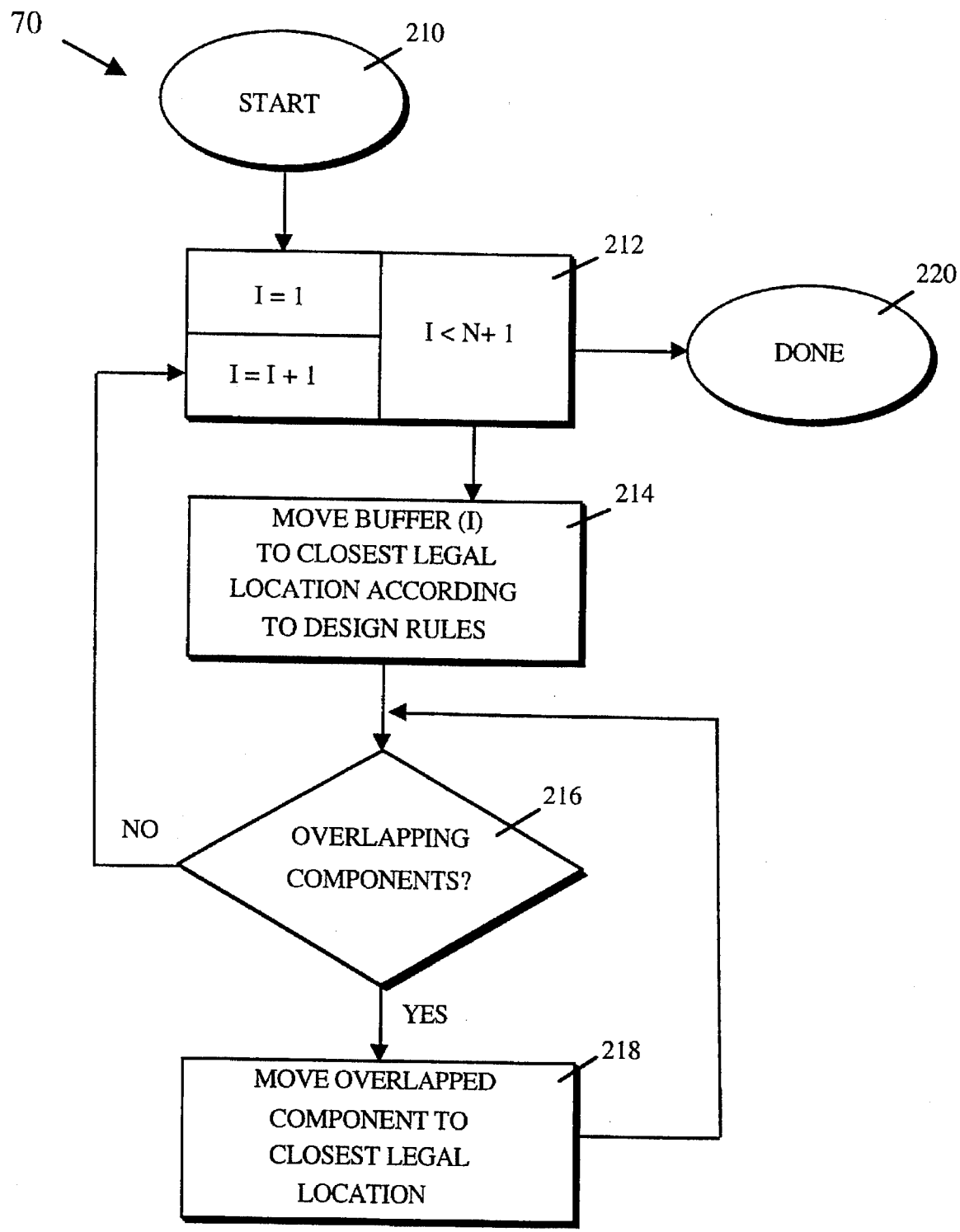
FIG. 9 is a flowchart describing in greater detail steps for moving buffers to their closest legal location, thereby detailing step 70 of FIG. 4.

Step 70 will now be described in more detail with reference to FIG. 9. The procedure 70 begins at step 210 and proceeds to an iteration loop 212 over the inserted buffers 58 and 60. In FIG. 9, N represents the number of inserted buffers 58 and 60, and I is the iteration variable. Since the computations which lead to buffer insertion 94 did not include their precise placement on the integrated circuit chip, the precise placement of an inserted buffer I must be snapped to its closest permitted location on the placement grid in a step 214. Various design rules may specify beforehand precisely which locations are permitted for components and/or buffers. Of course, the placement of a buffer at its closest location permitted by the design rules may place that buffer on top of another component in the original netlist.

Recall that in step 64 of FIG. 4, the components described by the netlist had their placements in the layout specified. If decision step 216 determines that the placement of inserted buffer I overlaps a component already placed in step 64, then those overlapped components will be moved slightly in a step 218. Of course, this movement will not be so dramatic as to disrupt the entire placement specified by step 64, i.e., the movement is merely incremental. The procedures of decision 216 and movement step 218 are repeated until there are no overlapping components within the original placement and the modified placements specified by clock net optimization. Once there are no overlapping components for the Ith inserted buffer, decision step 216 returns movement procedure 70 to the iteration loop 212. Once all inserted buffers have looped over in iteration 212, then the procedure 70 for moving buffers ends at a step 220.

Figure 10:
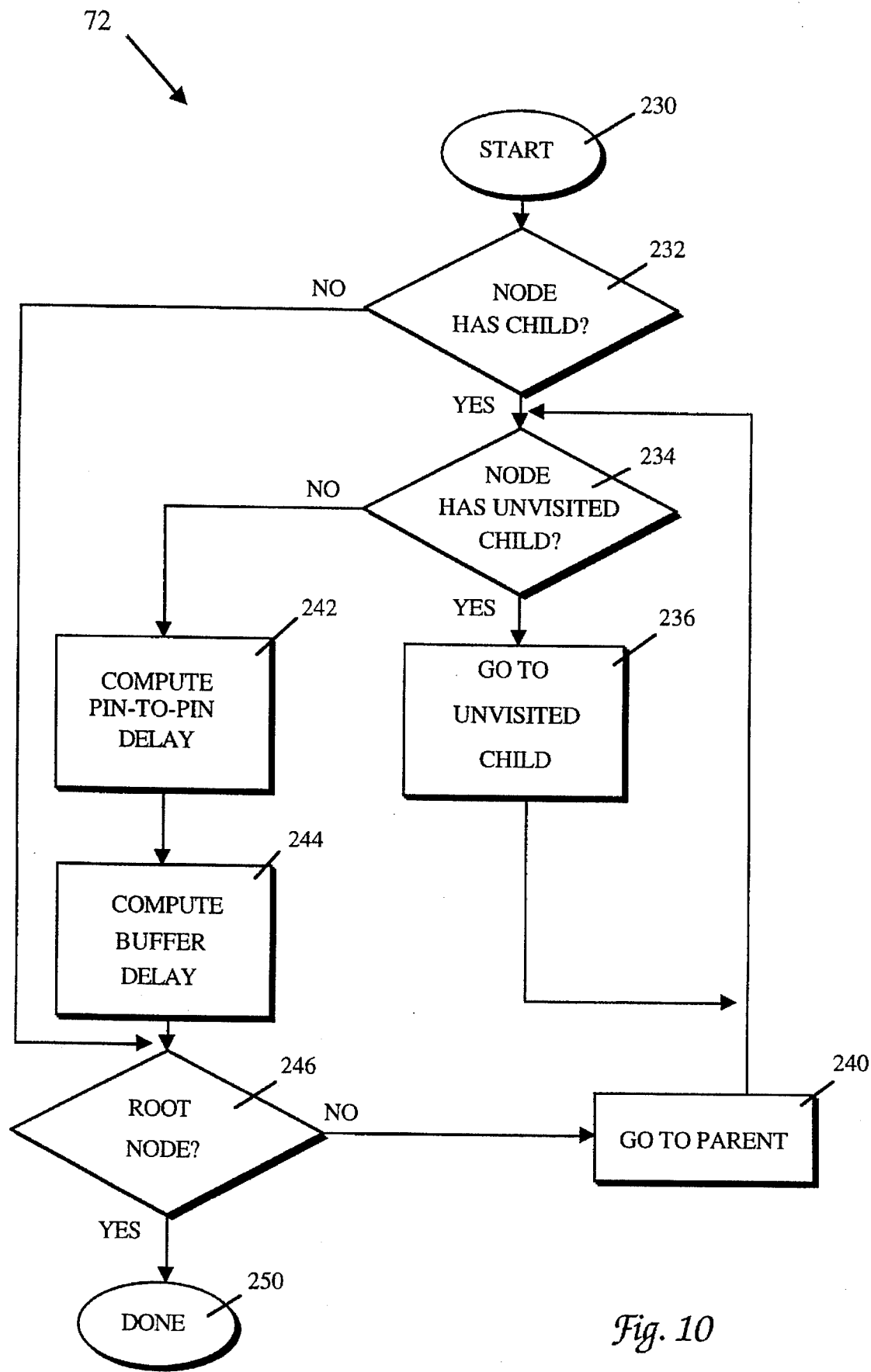
FIG. 10 is a flowchart describing in greater detail steps for verifying that the buffered clock tree satisfies circuit requirements, thereby detailing step 72 of FIG. 4.

The invention method for the layout stage 24' shown in FIG. 5 then continues with a verification 72 as outlined in a flow chart of FIG. 10. Step 72 begins with a step 230 and then proceeds to a decision step 232 to determine if a selected node has a child node. If it does, the verification step 72 flows from decision step 232 to decision step 234 to determine whether there are unvisited child nodes of the presently selected node. These unvisited children are selected in step 236. Decision step 234 and step 236 recursively visit all children of the selected node. Once all of these children have been visited, the result of decision step 234 is "no," and procedure 72 goes to step 242 to compute pin-to-pin delays between all nodes of Steiner subtrees of the buffered clock tree. Once all of the pin-to-pin delays have been computed and verified, the buffered delays arising from the inserted buffers are computed in a step 244. Then procedure 72 tests for the root node in a decision step 246.

In step 240 the parent node of the node in question in step 232 is selected. Step 240 then proceeds once again to decision step 234 to test the parent of the previously selected node. After performing steps 234, 236, 242, and 244 again, decision step 246 is reached once again. If the root node of the buffered clock net has not been reached, then a parent node of the currently selected node is chosen in step 240 and control is returned once again to decision step 234. Clearly, this procedure continues until all nodes of the new clock tree formed from the modified netlist have been visited. When the pin-to-pin delays and buffer delays have been computed in steps 242 and 244 for all levels of the clock tree, the verification step finishes at a step 250.

Figure 11:
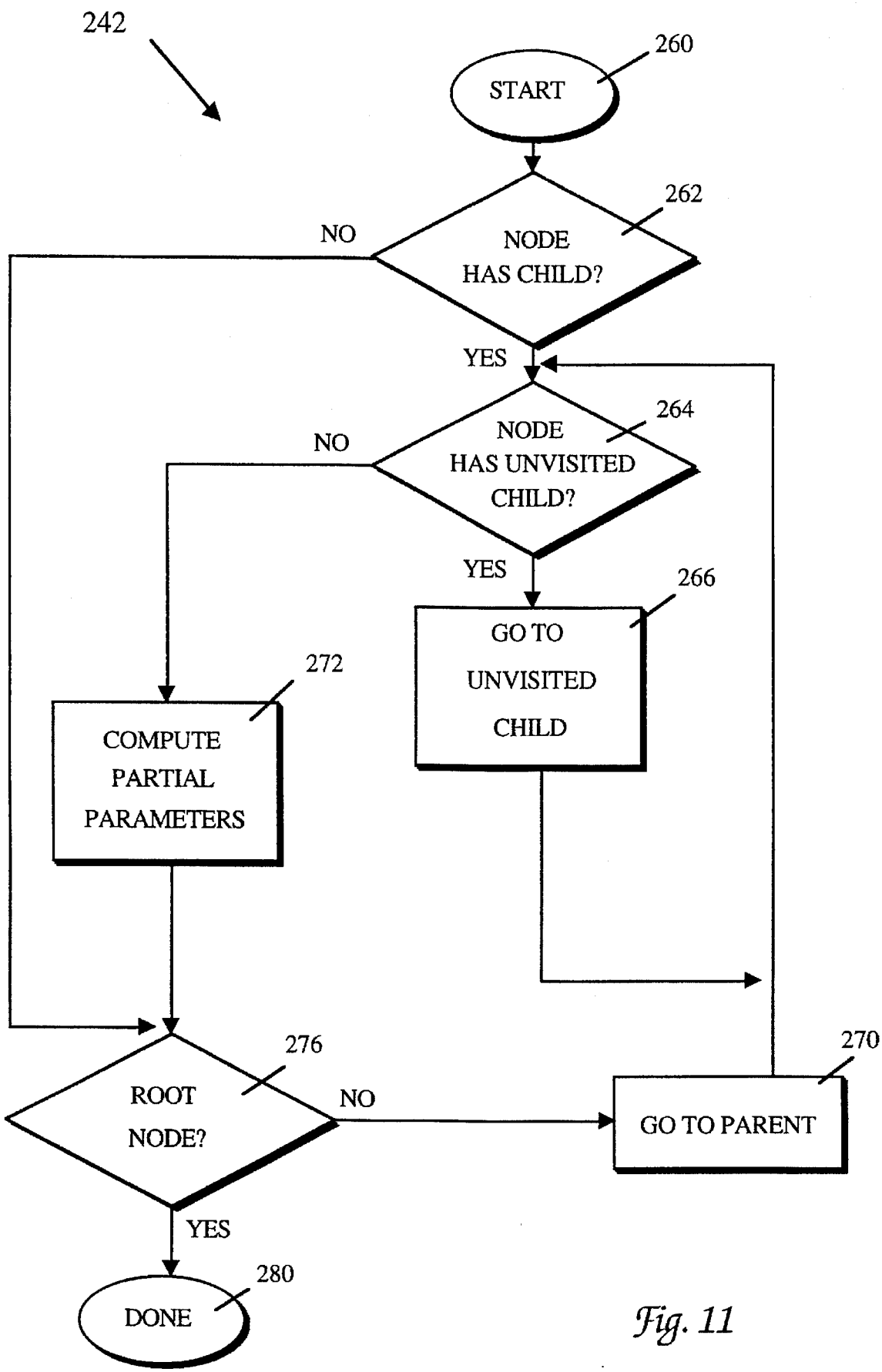
FIG. 11 is a flowchart describing in greater detail steps for computing pin-to-pin delay, step 242 of FIG. 10.

The computation of pin-to-pin delays 242 is diagrammed in a flow chart of FIG. 11. That procedure begins at a step 260. In exact analogy with verification steps 232, 234, 236, and 240 of FIG. 10 for the modified clock tree, pin-to-pin delay steps 262, 264, 266, and 270 traverse all nodes of the Steiner tree. Once all of those nodes have been traversed, decision step 264 permits the computation of partial parameters in a step 272. Unless there have been significant changes in the placement of components and buffers, these partial parameters are retrieved from digital storage. However, the placement may have changed enough to significantly alter the previously calculated partial parameters. When this occurs, they will be re-computed at step 272, and verified against the circuit specifications for the digital integrated circuit. Decision step 276 ensures that the computation of pin-to-pin delays 242 continues until the root node has been found. When the pin-to-pin delay has been computed for the root node, the computation of pin-to-pin delays 242 ends at a step 280.

Figure 12:
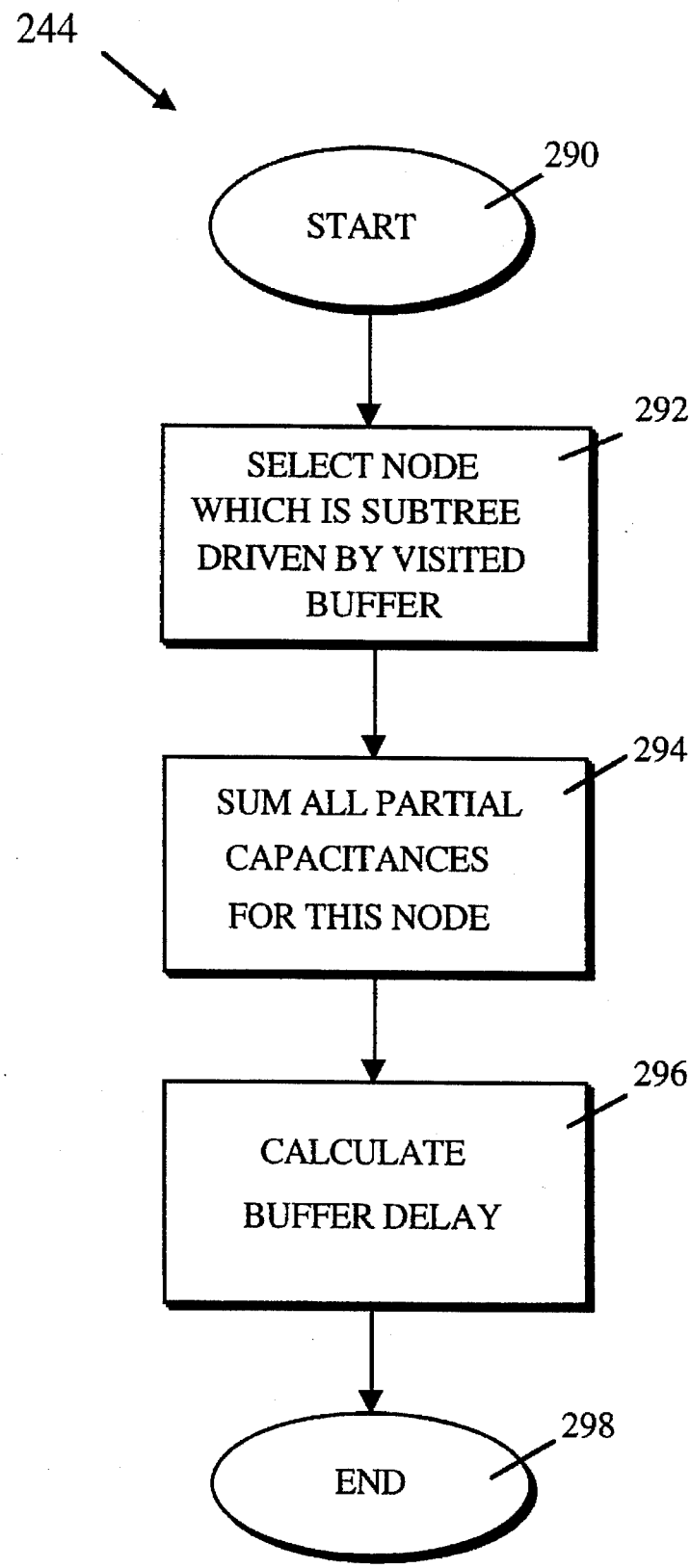
FIG. 12 is a flowchart describing in greater detail steps for computing buffer delay, step 244 of FIG. 10.

The computation of buffer delays 244 for the buffered clock tree is diagrammed in a flow chart of FIG. 12. The computation begins at a step 290 and proceeds by selecting a node in a step 292 which is a subtree driven by a visited buffer. Each inserted buffer is visited in turn until all buffer delays are computed. Partial capacitances and partial parameters are retrieved in a step 294 from digital storage to compute partial and sum capacitances for the selected node. Because this information is already stored, the computation of the buffer delay between the selected node and the inserted buffer is straightforward in a step 296. This computation is performed by standard formulas known in the art such as the lumped capacitance delay formula:

$$\text{delay} = t_i + S(C_L + C_0)$$

where $t_i$ is an intrinsic delay of the buffer, S is the skew rate, $C_L$ is the load capacitance of the buffer, and $C_0$ is the output capacitance of the buffer. The skew rate S is for the buffer with a unit load capacitance. $C_L$ includes wire capacitance and input capacitance of the devices driven by the buffer. The computation of buffer delays at a step 298 thus concludes the verification process 72 of the layout step outlined in FIG. 4.

The method just described forms the layout step 24' (FIG. 4) in a behavioral synthesis design and fabrication of integrated circuits. This new layout step 24' includes optimizing clock nets by analyzing the clock nets and inserting buffers (FIG. 5). The analysis includes constructing and assigning levels to Steiner subtrees of the clock trees (FIG. 6a) and computing partial parameters for the subtrees (FIGS. 6b and 6c). To satisfy circuit specifications, buffers are inserted (FIG. 5) at balance points (FIG. 7) of the subtrees having capacitances equalized (FIG. 8) on siblings of the subtrees to form a modified netlist and hence a modified clock tree. The new layout step 24' also includes a step of moving buffers (FIG. 9) to locations permitted by design specifications. It is then verified that the modified or "buffered" clock tree satisfies the circuit specifications (FIGS. 10 and 11). The optimization can then be performed again with altered circuit specifications eventually followed by a routing, or a routing can be performed directly to conclude the new layout step 24'.

While this invention has been described in terms of several preferred embodiments, there are alterations, permutations, and equivalents which fall within the scope of this invention. It should also be noted that there are many alternative ways of implementing both the process and apparatus of the present invention. It is therefore intended that the following appended claims be interpreted as including all such alterations, permutations, and equivalents as fall within the true spirit and scope of the present invention.

What is claimed is:

1. A method for making a digital integrated circuit comprising:

developing a set of circuit specifications for a digital integrated circuit including a maximum clock skew, a minimum driveability, and a maximum ramp delay;

describing said set of circuit specifications in a hardware description language and inputting said hardware description language into a digital computer system;

synthesizing on said digital computer system a netlist from said hardware description language which specifies circuitry of said integrated circuit, said synthesized netlist describing at least one clock net;

analyzing and inserting buffers as required into said netlist on said digital computer system to create a modified netlist which describes a circuit that has at most said maximum clock skew, at least said minimum driveability, and at most said maximum ramp delay said analyzing and inserting buffers including creating an initial routing for said clock net, computing partial parameters for said clock net by conducting a bottom up scan and a top down scan of said clock net, finding at least one balance point in said clock net based on said partial parameters, and inserting a driver into said clock net at said balance point; and producing a digital integrated circuit as specified by said modified netlist comprising a semiconductor die including said circuitry of said integrated circuit, said semiconductor die having a plurality of I/O pads, a package enclosing said integrated circuit die, a plurality of leads extending from said package, and a plurality of conductors coupling said plurality of I/O pads of said semiconductor die to said plurality of leads.

2. A method as recited in claim 1 further comprising the steps of:

laying out on said digital computer system at least portions of said circuitry of said integrated circuit; and producing at least one integrated circuit mask based upon said laying out step;

wherein said integrated circuit is produced, at least in part, with said at least one integrated circuit mask.

3. A method as recited in claim 2 wherein said step of laying out comprises laying out at least portions of said circuitry for a gate array circuit.

4. A method as recited in claim 2 wherein said step of laying out comprises laying out at least portions of said circuitry for a standard cell circuit.

5. A method as recited in claim 1 further comprising the step of:

developing on said digital computer system a description of a placement of physical electronic devices corresponding to said previously synthesized netlist prior to said analyzing and inserting steps.

6. A method as recited in claim 5 further comprising the step of modifying said description of a placement based upon said modified netlist to produce a modified description of a placement.

7. A method as recited in claim 6 further comprising the steps of:

verifying whether all of said clock nets implemented in said modified description of a placement meets user-defined circuit parameters;

repeating said analyzing and inserting steps if said modified description does not meet user-defined circuit parameters; and routing interconnections between said physical electronic devices as described in said modified description of placement when all of said clock nets implemented in said modified description meet said user-defined circuit parameters.

8. A method as recited in claim 7 wherein said analyzing and inserting steps are performed recursively until no clock net has greater than a user-defined maximum clock skew, less than a user-defined minimum driveability, and greater than a user-defined maximum ramp delay.

9. A method for laying out a digital integrated circuit comprising:

analyzing on a digital computer system a previously synthesized netlist created by a synthesizer routine implemented on said digital computer system, said previously synthesized netlist describing at least one clock net;

inserting into said previously synthesized netlist a description of at least one buffer such that no clock net described by said netlist has greater than a user-defined maximum clock skew, less than a user-defined minimum driveability, and greater than a user-defined maximum ramp delay, thereby creating a modified netlist; and wherein said analyzing and inserting are performed recursively until no clock net has greater than a user-defined maximum clock skew, less than a user-defined minimum driveability, and greater than a user-defined maximum ramp delay, and said analyzing and inserting include:

(a) choosing a clock net;

(b) creating on said computer system an initial routing comprising an initial sibling of an initial sibling level for said clock net;

(c) computing partial parameters for each sibling;

(d) finding a balance point of each sibling;

(e) dividing each sibling into a plurality of siblings of a subsequent sibling level if all siblings at a sibling level do not have greater than a user-defined maximum clock skew, less than a user-defined minimum driveability, and greater than a user-defined maximum ramp delay, and repeating (c) through (e) until all siblings of a subsequent sibling level meet said criteria;

(f) determining if the level is at said initial level and choosing an additional clock net and repeating steps (b) to (f) if it is; and (g) inserting a driver into said clock net at said balance point of each sibling at said subsequent level, resetting the sibling level to said initial sibling level, and repeating (c) to (f) until all clock nets have been processed.

10. A method for laying out a digital integrated circuit as recited in claim 9 further comprising the step of:

developing on said digital computer system a description of a placement of physical electronic devices corresponding to said previously synthesized netlist prior to said analyzing and inserting steps.

11. A method for laying out a digital integrated circuit as recited in claim 10 further comprising the step of modifying said description of a placement based upon said modified netlist to produce a modified description of a placement.

12. A method for laying out a digital integrated circuit as recited in claim 11 further comprising the steps of:

verifying whether all of said clock nets implemented in said modified description of a placement meets user-defined circuit parameters;

repeating said analyzing and inserting steps if said modified description does not meet user-defined circuit parameters; and routing interconnections between said physical electronic devices as described in said modified description of placement when all of said clock nets implemented in said modified description meet said user-defined circuit parameters.

13. A method for laying out a digital integrated circuit as recited in claim 9 wherein said balance point is at a particular point in clock net having minimum skew, said skew being the difference between the maximum and minimum latency delays between specified levels of said clock net.

14. A method for laying out a digital integrated circuit as recited in claim 13 wherein said balance point is determined by said partial parameters.

15. A system for creating integrated circuit masks comprising:

(a) a digital hardware description processor including a central processing unit (CPU), digital storage coupled to said CPU, and a user input device coupled to said CPU, said hardware description processor being operative to;

(i) create mask generation data from a hardware description of a set of circuit specifications for a digital integrated circuit received from said user input device, said circuit specifications including a maximum clock skew, a minimum driveability, and a maximum ramp delay, (ii) develop a netlist from said hardware description, said netlist specifying circuitry of said integrated circuit and describing at least one clock net, (iii) insert buffers, as required, into said netlist so as to provide a modified netlist which describes an integrated circuit having at most said maximum clock skew, at least said minimum driveability, and at most said maximum ramp delay, by creating an initial routing for said clock net, computing partial parameters for said clock net by conducting a bottom up scan and a top down scan of said clock net, finding at least one balance point in said clock net based on said partial parameters, inserting a driver into said clock net at said balance point;

(iv) develop said mask generation data from said modified netlist and store said mask generation data in said digital storage; and (b) a digital mask generator coupled to said digital storage for making at least one integrated circuit mask from said mask generation data stored in said digital storage.

16. A system as recited in claim 15 wherein said hardware description processor comprises a synthesizer for producing said netlist, and layout means for inserting said buffers.

17. A system as recited in claim 16 wherein said layout means includes:

means for analyzing on said digital hardware description processor a previously synthesized netlist created by a synthesizer routine implemented on said digital hardware description processor said previously synthesized netlist describing at least one clock net; and means for inserting into said previously synthesized netlist a description of at least one buffer such that no clock net described by said netlist has greater than a user-defined maximum clock skew, less than a user-defined minimum driveability, and greater than a user-defined maximum ramp delay, thereby creating a modified netlist.

18. A system as recited in claim 17 further comprising:

means for developing on said digital hardware description processor a description of a placement of physical electronic devices corresponding to said previously synthesized netlist prior to said analyzing and inserting steps.

19. A system as recited in claim 18 further comprising means for modifying said description of a placement based upon said modified netlist to produce a modified description of a placement.

20. A system as recited in claim 19 further comprising:

means for verifying whether all of said clock nets implemented in said modified description of a placement meets user-defined circuit parameters;

means for repeating said analyzing and inserting steps if said modified description does not meet user-defined circuit parameters; and means for routing interconnections between said physical electronic devices as described in said modified description of placement when all of said clock nets implemented in said modified description meet said user-defined circuit parameters.

* * * * *